United States Patent [19]

Mason

[11] 4,180,825
[45] Dec. 25, 1979

[54] HETEROEPITAXIAL DEPOSITION OF GAP ON SILICON SUBSTRATES

[75] Inventor: Donald R. Mason, Indialantic, Fla.

[73] Assignee: Harris Corporation, Melbourne, Fla.

[21] Appl. No.: 911,557

[22] Filed: May 31, 1978

Related U.S. Application Data

[62] Division of Ser. No. 833,935, Sep. 19, 1977, Pat. No. 4,120,706.

[51] Int. Cl.² .................................... H01L 29/161
[52] U.S. Cl. .................................. 357/16; 357/30; 357/61; 357/17
[58] Field of Search .............. 357/16, 30, 61, 4, 17

[56] References Cited
U.S. PATENT DOCUMENTS

| | | | |
|---|---|---|---|
| 3,766,447 | 10/1973 | Mason | 357/16 |
| 3,963,539 | 6/1976 | Kemlage | 148/175 |
| 3,985,590 | 10/1976 | Mason | 148/175 |
| 4,120,706 | 10/1978 | Mason | 148/175 |

Primary Examiner—Martin H. Edlow
Attorney, Agent, or Firm—Leitner, Palan, Martin & Bernstein

[57] ABSTRACT

A crack free layer of GaP is epitaxially deposited on a silicon phosphide surface of a silicon substrate having an (III) orientation. The silicon substrate is prebaked on a carbide coated susceptor with palladium diffused hydrogen at about 1200° C. and pretreated with phosphine at about 1140° C. to form the silicon phosphide surface. The temperature is lowered to 800°–900° C. in the presence of phosphine and trimethyl gallium is introduced at a ratio of 1 to 10 with the phosphine. Cracks in the gallium phosphide are prevented by roughing the bottom non-phosphide surface of the silicon substrate such that the roughed surface is under compressive stress and induces tensile stress on the phosphided surface to reduce the compressive stress produce by gallium phosphide layer when the substrate is annealed at about 1200° C.

7 Claims, 1 Drawing Figure

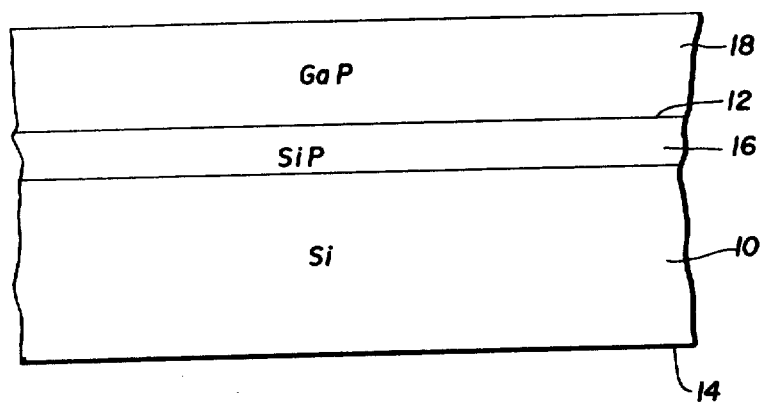

HETEROEPITAXIAL DEPOSITION OF GAP ON SILICON SUBSTRATES

This is a divisional of application Ser. No. 833,935, filed Sept. 19, 1977 now U.S. Pat. No. 4,120,706.

BACKGROUND OF THE INVENTION

1. Field of the Invention

The present invention relates generally to semiconductor structures and process for manufacture of "light emitting diodes" and more specifically to epitaxially depositing gallium phosphide, crack free on a silicon substrate.

In order to reduce the cost of materials and produce light emitting diode displays monolithically with silicon integrated circuits, there is great interest in forming layers of gallium phosphide on silicon substrates. The feasibility of forming such a structure rises because of the close match in lattic constants of silicon (5.43 A°) and gallium phosphide (5.45 A°). U.S. Pat. No. 3,766,447 overcomes the problems of mismatch between silicon and gallium phosphide by using a graded layer of a silicon-germanium alloy therebetween. It is desirable to form an epitaxial gallium phosphide film directly on the silicon substrates of high quality and eliminating the cracks formed therein by stress induced by thermal expansion.

A survey of the literature shows that epitaxial GaP films were grown on Si using electrolysis of $NaPO_3$, NaF and $Ga_2O_3$ (Cuomo, J. J., and Gambino, R. J., *J. Electrochem. Soc.*, 115, 755-759 (1968)) and by decomposing a mixture of gallium triethyl and phosphorous triethyl at 485° C. (Thomas, R. W., *J. Electrochem. Soc.*, 116, 1449-1450 (1969)). GaP films were grown on sapphire using trimethyl gallium and phosphine (Manasevit, H. M., and Simpson, W. I., *J. Electrochem. Soc.* 116, 1725-1732 (1969)). Igarashi grew GaP films on silicon by an evaporation method and noticed crack lines running in cleavage directions on (111), (110), and (100) crystal plains. (Igarashi, Osamu, *J. Appl. Phys.*, 41, 3190-3192 (1970)). By depositing onto silicon through windows etched into a $SiO_2$ masking film, the GaP film cracking apparently disappeared. (Igarashi, Osamu, *J. Electrochem. Soc.*, 119, 1430-1431 (1972)). Gallium phosphide films on silicon using eutectic epitaxy from Pb solvent and from Sn solvent have also been used. (Rosztoczy, F. E., and Stein, W. W., *J. Electrochem. Soc.*, 119, 1119-1121 (1972)). Also, West German Patent No. 2,144,828, Mar. 30, 1972.) Chloride transport processes have also been used to form GaP on silicon substrates and cracks in the GaP layers were also observed. (Huber, H., and Winstel, G. H., *Siemens Forsch. u Entwicki. Ber.*, 2, 171-174 (1973).)

The achievements and difficulties of the prior art are also discussed specifically in U.S. Pat. No. 3,963,538. This patent provides the gallium phosphide layer on silicon having an orientation of (100). The process described therein has not been successfully used to form a gallium phosphide layer on silicon having an orientation of (111).

U.S. Pat. No. 3,699,401 discusses the formation of gallium phosphide using phosphine and trimethyl gallium on a synthetic sapphire base with a silicon layer therebetween.

Thus there exists a need for forming crack free gallium phosphide layers on silicon substrates having a crystal orientation of (111).

SUMMARY OF THE INVENTION

The process of the present invention forms crack-free gallium phosphide on a silicon substrate having a crystallographic orientation of (111). The silicon, preferably 4½° off the(111) plane, is placed in a carbide coated susceptor and subjected to a pallidium diffused hydrogen prebake at approximately 1200° C. for approximately ten minutes. The substrate is then pretreated in phosphine at between 1100-1140° C. for up to twenty minutes so as to phosphide the silicon surface and form a silicon phosphide therein. The temperature is then lowered to a range of 820-900° C. and trimethyl gallium is introduced with the phosphine at a ratio of trimethyl gallium to phosphine of one to ten. The epitaxial deposition of the gallium phosphide is continued at a rate of approximately 0.1 microns per minute until the desired thickness is achieved.

To prevent the cracks observed by Igarashi and by Huber and Winstel, special pretreatment of the silicon substrate is performed. The surface of the silicon opposite the surface which will be phosphide treated is roughened by lapping or grinding instead of the polishing performed on the to-be-phosphided side. This roughening causes the rougher surface to have a different coefficient of thermal expansion such that after the substrate is annealed at 1200° C., and later cooled, compressive stress is induced on the roughened side of the substrate and tensile stress is induced on the to-be-phosphided side of the substrate. The tensile stress induced on the to-be-phosphided side of the substrate counteracts and reduces the compressive stress induced by the gallium phosphide film deposited thereon which has a greater coefficient of thermal expansion than the silicon. The roughening of the silicon substrate and the annealing at high temperature is but one example of the process of roughening the non-treated surface of a bimetal structure to produce the equivalent of a trimetal structure wherein the coefficients of linear thermal expansion diminishing from the top layer down through to the roughened surface and thereby reduces and releases the stress inherent in a bimetal system. Therefore, another object of the invention is to relieve the stress inherent in a bimetal system wherein coefficients of thermal expansion are different.

OBJECTS OF THE INVENTION

An object of the present invention is to provide a method of forming gallium phosphide directly on a silicon substrate having a crystal-orientation of (111).

Another object is to provide a method for epitaxially depositing gallium phosphide using phosphine and trimethyl gallium to an increased thickness over that of the prior art and having a crack-free surface.

A further object of the invention is to provide a method of preventing cracks between the two layers of semiconductor materials having different coefficients of thermal expansion.

Other objects, advantages and novel features of the present invention will become apparent from the following detailed description of the invention when considered in conjunction with the accompanying drawings.

BRIEF DESCRIPTION OF THE DRAWINGS

The FIGURE is a cross-sectional view of a portion of a silicon substrate having a gallium phosphide layer thereon.

DESCRIPTION OF THE PREFERRED EMBODIMENTS

The method of process of the present invention uses phosphine and trimethyl gallium to produce gallium phosphide on a silicon substrate. Silicon substrate 10, having a lower surface 14 and an upper surface 12 may be, for example, 0.015 inches thick and 2 inches in diameter. It is preepitaxially cleaned and loaded onto a carbide-coated susceptor, for example, graphite. A radio frequency reactor heats the substrate to approximately 1200° C., measured optically, for about ten minutes and the substrate is subjected to palladium diffused hydrogen. The temperature is then lowered to near or below the peritectric decomposition temperature of silicon phosphide or approximately 1100-1140° C., measured optically. Phosphine in a hydrogen carrier is introduced such that the upper surface 12 of the silicon substrate is exposed for approximately twenty minutes to phosphide the surface to form a silicon phosphide layer 16.

After phosphiding the upper silicon surface 12, the temperature is further lowered under phosphine to approximately 820° C. to 900° C., measured optically, and trimethyl gallium flow is initiated. The ratio of phosphine to trimethyl gallium being ten to one, the epitaxial deposition rate of the gallium phosphide is approximately 0.1 microns per minute. This continues until the desired thickness of the gallium phosphide is formed. This is illustrated in the FIGURE as layer 18.

Experimentation with different crystal-orientated surface planes of silicon having gallium phosphide films epitaxially deposited thereon has resulted in a selection of off-orientations of 0° to 10° with $4\frac{1}{2}$° being preferred. With no off orientation component of crystal surface direction, vertical growth is favored and excessive nuclearization results in polycrystalline nodular layers. Too much off-orientation, for example, about 10°, accentuates the horizontal growth and the wafers have a shingled appearance. At $4\frac{1}{2}$° off-orientation, the two mechanisms appear to be quite evenly balanced and it is possible to obtain films having a high degree of smoothness.

As noted in the prior art, oxygen in the system promotes nuclearization. Reproducible gallium phosphide layers generally are not obtainable without in-situ palladium diffused hydrogen.

Another critical step of the present process is the phosphiding treatment of the silicon polished surface 12. The phosphiding promotes good epitaxy. In going from the diamond cubic structure of silicon to the zinc blend structure of gallium phosphide, the entropy of the crystalline system must be decreased. Substrates must be made to choose to add gallium and phosphorous layers alternately rather than at random. This is accomplished by phosphiding the surface 12 of the silicon substrate near or below the peritectric decomposition temperature of silicon phosphide which is about 1130° C. The silicon-phosphide bond distance has been measured as 2.36 A° which is equivalent to the gallium-phosphide bond distance. Hence, a phosphided silicon surface not only promotes the probability that the next atomic layer will be a gallium layer, but also generates an inter-atomic distance more nearly equal to that of gallium phosphide. Preferably, the depth of silicon phosphide layer 16 formed is 2 microns to 8 microns.

By being able to form gallium phosphide layers on (111) orientated silicon substrates, it is possible to incorporate a light emitting diode on silicon using standard junction isolation technology as disclosed in U.S. Pat. No. 3,935,040. In addition to light emitting diode displays which have monolithic active elements in a silicon integrated circuit, the composite structure illustrated in the FIGURE could also be used to form wide band gap emitters in gallium phosphide-silicon transistors, for heterojunction solar cells, heterojunction phototransistors, high temperature rectifying diodes and high temperature transistor structures.

The process just described will produce, at a thickness exceeding four microns, the cracks noted in the prior art. The cracks in the gallium phosphide film 18 produced by prior art techniques and untreated silicon substrates indicate that the gallium phosphide is under tension whereas the silicon is under compression at their interface. Thus, the composite semiconductor structure is equivalent to a bimetallic system. As the gallium phosphide is deposed in the 800-900° C. temperature range, presumably the bimetallic structure is unstressed. Since the linear coefficient of thermal expansion of gallium phosphide is much greater (5.1 to $6.25 \times 10^{-6}$° C.$^{-}$) than silicon over the cooling range, the gallium phosphide shrinks by 1.5 to 1.7 percent relative to the silicon. The shrinkage induced warpage in the structure which has been measured as great as 14 mils in a 15 mil thick, 2 inch diameter wafer and begins to bow towards the gallium phosphide. Cracks in the gallium phosphide layer then develop to release the stress and diminish the warpage.

In order to prevent these cracks, additional pretreating of the silicon substrate is required. Silicon substrate is roughened on the bottom surface 14 by lapping or by grinding. By damaging or roughening lower surface 14, the bottom surface 14 contracts less or has a lower coefficient of thermal expansion than the polished or undamaged surface 12. The residual strain on the silicon wafer is relieved by annealing at 1200° C., optically measured. After the substrate is annealed and cooled, the lower surface 14 is under compressive stress and induces tensile stress on the upper surface 12. With the gallium phosphide film or layer 18 on the upper surface 12 of the silicon substrate, the tensile strength induced by roughened side 14 reduces the compressive stress induced by the gallium phosphide film layer 18.

The bimetallic structure having the roughened surface 14 is equivalent to a tri-metallic structure with the coefficients of linear thermal expansion diminishing from the gallium phosphide layer 18 to the polished or unroughened silicon surface 12 to the roughened silicon surface 14. By using this technique of having the backside lapped or grinded with a depth of damage from 15 to 25 microns, uncracked gallium phosphide films as thick as eight or ten microns have been prepared.

From the preceding description of the preferred embodiments, it is evident that the objects of the invention are obtained in that a gallium phosphide film is formed using trimethyl gallium and phosphine on a silicon substrate having a (111) surface orientation. Thick gallium phosphide surfaces having no cracks result from the roughening of the lower surface of the silicon and the annealing of the silicon at 1200° C. Although the reduction of cracks in the gallium phosphide surface on silicon has been described, the roughening technique may also be used for any bimetallic system for any semiconductor system having, for example III-V compounds formed on substrates wherein the substrate has a lower coefficient of thermal expansion than the III-V compound. The essence of the process being that a two metallic system having stress induced by thermal expansion is converted to the equivalent of a three-metallic system to relieve the stress. Other examples of combinations of materials which may be used are ZnSe on Ge or GaAs. Although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. A semiconductor structure comprising:
   a silicon substrate having a first and second surface in the (111) plane;
   said first surface being silicon phosphide to a depth in the range of 2 to 8 microns; and
   an epitaxial layer of gallium phosphide on said first surface having a thickness of up to eight microns without cracks.

2. The semiconductor structure according to claim 1 wherein said second surface is under compressive stress and induces tensile stress in said first surface.

3. The semiconductor structure according to claim 1 wherein said epitaxial layer induces compressive stress in said first surface.

4. The semiconductor structure according to claim 1 wherein said first surface is smooth prior to the epitaxial deposition of gallium phosphide and said second layer is roughened.

5. The semiconductor structure according to claim 4 wherein the depth damage to said second surface is in the range of 15 to 25 microns.

6. The semiconductor structure according to claim 1 when said surfaces are up to ten degrees off the (111) plane.

7. The semiconductor structure according to claim 6 wherein said surfaces are approximately four and one half degrees off the (111) plane.

* * * * *